United States Patent [19]

Song

[11] Patent Number: 5,987,067
[45] Date of Patent: Nov. 16, 1999

[54] VARIABLE ENCODING RATE PUNCTURER

[75] Inventor: Jun Kyu Song, Kyoungkido, Rep. of Korea

[73] Assignee: Hyundai Electronics Industries Co., Ltd., Kyoundkido, Rep. of Korea

[21] Appl. No.: 08/837,420

[22] Filed: Apr. 17, 1997

[30] Foreign Application Priority Data

Jun. 25, 1996 [KR] Rep. of Korea ...................... 96-23652

[51] Int. Cl.⁶ .............................. H04B 1/66; H03M 7/00; H03M 7/40
[52] U.S. Cl. .......................... 375/253; 375/240; 714/790; 341/61; 341/67; 370/377
[58] Field of Search .................................. 375/240, 253, 375/246; 341/67, 61, 78, 51; 358/261.1, 261.2, 426; 370/468, 477; 371/43.2; 714/790

[56] References Cited

U.S. PATENT DOCUMENTS

| | | | |
|---|---|---|---|
| 4,730,348 | 3/1988 | MacCrisken | 375/240 |
| 5,438,590 | 8/1995 | Tzukerman et al. | 375/259 |

FOREIGN PATENT DOCUMENTS

| | | |
|---|---|---|
| 0 618695 A2 | 10/1994 | European Pat. Off. . |
| 0 680152 A2 | 11/1995 | European Pat. Off. . |
| 60-142627 | 7/1985 | Japan . |
| 4-335718 | 11/1992 | Japan . |

*Primary Examiner*—Stephen Chin
*Assistant Examiner*—Betsy L. Deppe
*Attorney, Agent, or Firm*—Jacobson, Price, Holman & Stern, PLLC

[57] ABSTRACT

A variable encoding puncturer, for encoding data in response to a variable encoding rate, in a digital broadcasting communication encoder, including a control unit for controlling an alignment of input data and a selection of a compression matrix, and an alignment of output data according to a variable encoding rate inputted from an external circuit; an input data aligning control unit for outputting the aligned data in parallel in response to an input clock signal after aligning data with a variable encoding rate in response to a control of the control unit; an input buffer for storing, in order, the aligned data from the input data aligning control unit; an output data aligning control unit for selecting the aligned data from the input buffer according to the variable encoding rate under the control of the control unit and for outputting the selected data; and an output buffer outputting the selected data encoded data from the output data as aligning control unit in response to an output clock signal.

3 Claims, 3 Drawing Sheets

FIG. 3

(A) $\begin{pmatrix} X \\ Y \end{pmatrix} = \begin{pmatrix} X_1 & X_2 & X_3 & X_4 & X_5 & X_6 & X_7 \\ Y_1 & Y_2 & Y_3 & Y_4 & Y_5 & Y_6 & Y_7 \end{pmatrix}$ (B) $\begin{pmatrix} I' \\ Q' \end{pmatrix} = \begin{pmatrix} X_1 & \cdot & \cdot & \cdot & X_5 & \cdot & X_7 \\ Y_1 & Y_2 & Y_3 & Y_4 & \cdot & Y_6 & \cdot \end{pmatrix}$ (C) $\begin{pmatrix} I \\ Q \end{pmatrix} = \begin{pmatrix} X_1 & X_2 & Y_4 & Y_6 \\ Y_1 & Y_3 & X_5 & X_7 \end{pmatrix}$

VARIABLE ENCODING RATE PUNCTURER

BACKGROUND OF THE INVENTION

1. Field of the Invention

The present invention relates to a variable encoding rate puncturer, which encodes data in response to a variable encoding rate, in a digital broadcasting encoder.

2. Description of the Prior Art

The development of a digital communication system has been gradually replacing an analog method with a digital method in a broadcasting communication transmitting and receiving technology. In particular, with the development of the digital signal process, picture and audio signals, which have been difficult to transmit and receive in a limited bandwidth due to a large quantity of transmission data, can now be transmitted. This digital data transmitting method is becoming the world standard.

As stated above, much more transmission data can be transmitted in a limited bandwidth by minimizing the transmission errors according to a property of an encoder/decoder and by reducing the quantity of the transmission data. At this time, its quantity can be varied in accordance with a selected standard of a compression matrix.

Accordingly, a variable encoding rate puncturer, which generates output data in accordance with an encoding rate determined by a transmission system, is required for data compression.

SUMMARY OF THE INVENTION

An object of the present invention is to provide a variable encoding rate puncturer capable of varying the encoding rate by using simple circuits and control units.

In accordance with the present invention, there is provided a variable encoding rate puncturer comprising: a control unit for controlling an alignment of input data and a selection of a compression matrix, and an alignment of output data according to a variable encoding rate inputted from an external circuit; an input data aligning control unit for outputting said aligned data in parallel in response to an input clock signal after aligning data with a variable encoding rate in response to a control of said control unit; an input buffer for storing, in order, said aligned data from said input data aligning control unit; an output data aligning control unit for selecting said aligned data from said input buffer according to said variable encoding rate under the control of said control unit and for outputting the selected data; and an output buffer outputting said selected data encoded data from said output data aligning control unit in response to an output clock signal.

BRIEF DESCRIPTION OF THE DRAWINGS

These and other objects, features and advantages of the present invention will be more fully apparent from the description of the embodiments with reference to the accompanying drawings, in which:

FIGS. 3A to 3C are state diagrams illustrating input and output data with an encoding rate of 7/8.

DETAILED DESCRIPTION OF THE PREFERRED EMBODIMENTS

An embodiment according to the present invention will be described below with reference to accompanying drawings.

Figure 1:
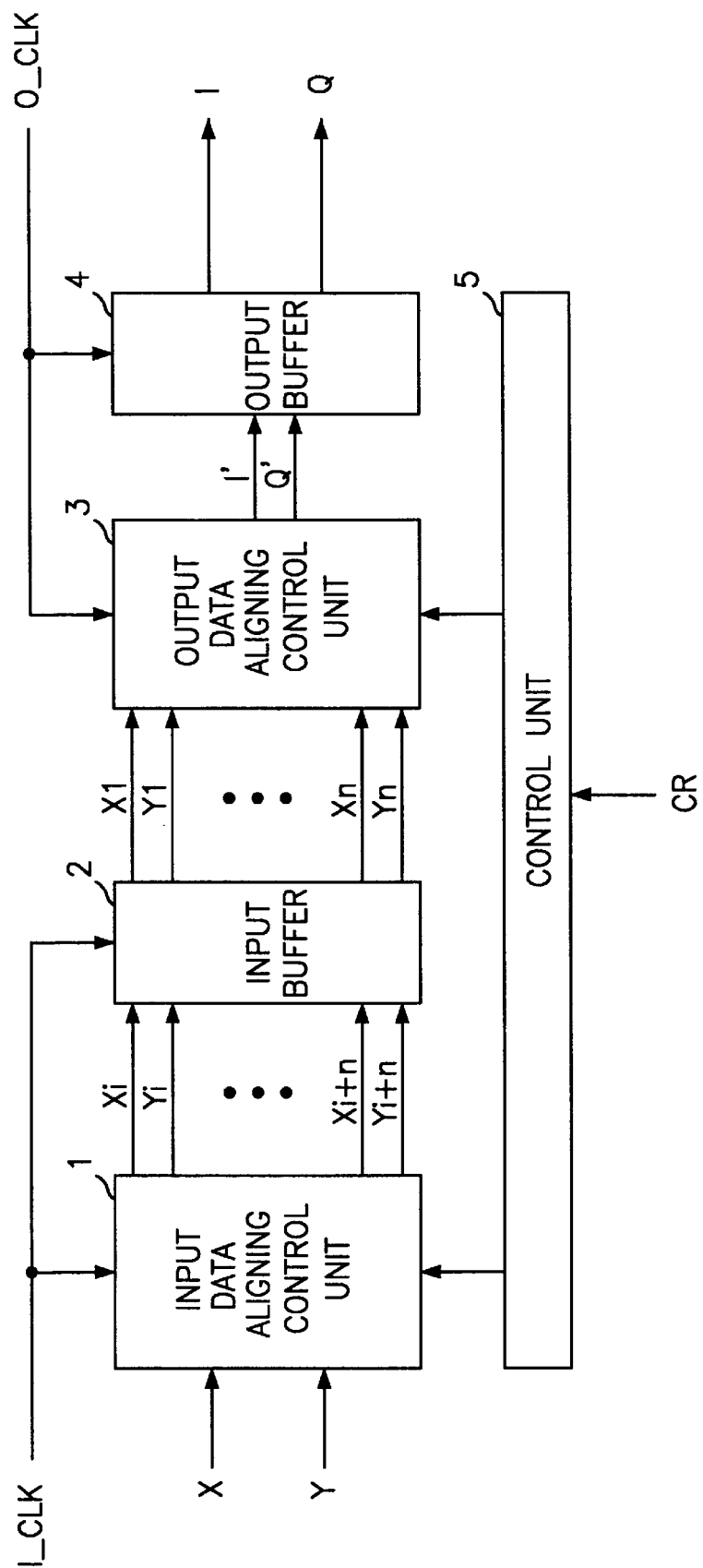
FIG. 1 is a block diagram illustrating a variable encoding rate puncturer according to the present invention.

Referring to FIG. 1, in accordance with the present invention, a variable encoding rate puncturer includes a control unit 5, an input data aligning control unit 1, an input buffer 2, an output data aligning control unit 3, and an output buffer 4.

The control unit 5 controls each module in accordance with each variable encoding rate based on the inputted CR (Code Rate). Namely, the control unit 5 controls an alignment of input data, a selection of compression matrixes, and an alignment of output data in accordance with a variable encoding rate inputted from an external circuit. For this control, the control unit 5 generates control signals controlling the input data aligning control unit 1 and the output data aligning control unit 3. The input data aligning control unit 1 aligns the input data (X,Y) according to said control unit 5, with a variable encoding rate, and outputs the aligned data to the input buffer 2 in parallel in response to an input clock I-CLK. The input buffer 2 stores, in order, the aligned data which are outputted from the input data aligning control unit 1. The output data aligning control unit 3 selects data from the aligned parallel data, outputted from said input buffer 2 in accordance with control of said control unit 5, in response to a desired variable encoding rate. The output buffer 4 transmits said encoded data outputted from the output data aligning control unit 3 to an external circuit, being synchronized with an output clock O-CLK.

Hereinafter, the behavior of the variable encoding rate puncturer for the present invention will be described.

Inputs, outputs and compression matrixes of a puncturer with the encoding rates of 3/4 and 7/8 are respectively represented in the following table:

TABLE 1

| Encoding rate | 3/4 | 7/8 |
|---|---|---|
| INPUT | $X = X_1 X_2 X_3$ | $X = X_1 X_2 X_3 X_4 X_5 X_6 X_7$ |
|  | $Y = Y_1 Y_2 Y_3$ | $Y = Y_1 Y_2 Y_3 Y_4 Y_5 Y_6 Y_7$ |
| Compression Matrix | X:1 0 1 | X:1 0 0 0 1 0 1 |
|  | Y:1 1 0 | Y:1 1 1 1 0 1 0 |
| OUTPUT | $I = X_1 Y_2$ | $I = X_1 Y_2 Y_4 Y_6$ |
|  | $Q = Y_1 X_3$ | $Q = Y_1 Y_3 X_5 X_7$ |

As shown in Table 1, in the case of the encoding rate of 3/4, three pairs of input data are encoded to two pairs of output data. And, in the case of the encoding rate of 7/8, seven pairs of input data are encoded to four pairs of output data.

At this time, it should be noted that, in accordance with each encoding rate, a conversion compression matrix and a form of output data are varied. Namely, data which are placed in positions having value "1" of a conversion compression matrix can be transmitted, and data which are placed in positions having value "0" of a conversion compression matrix are removed.

Hereinafter, a data process of a puncturer with the encoding rate of 7/8 will be explained referring to Table 1.

The transmitting data are generated as output data, by aligning and removing input data in order, according to the conversion compression matrix.

The input data (X,Y) from the input data aligning control unit 1 is, in order, stored in the input buffer 2 in accordance with the encoding rate.

Figure 2:
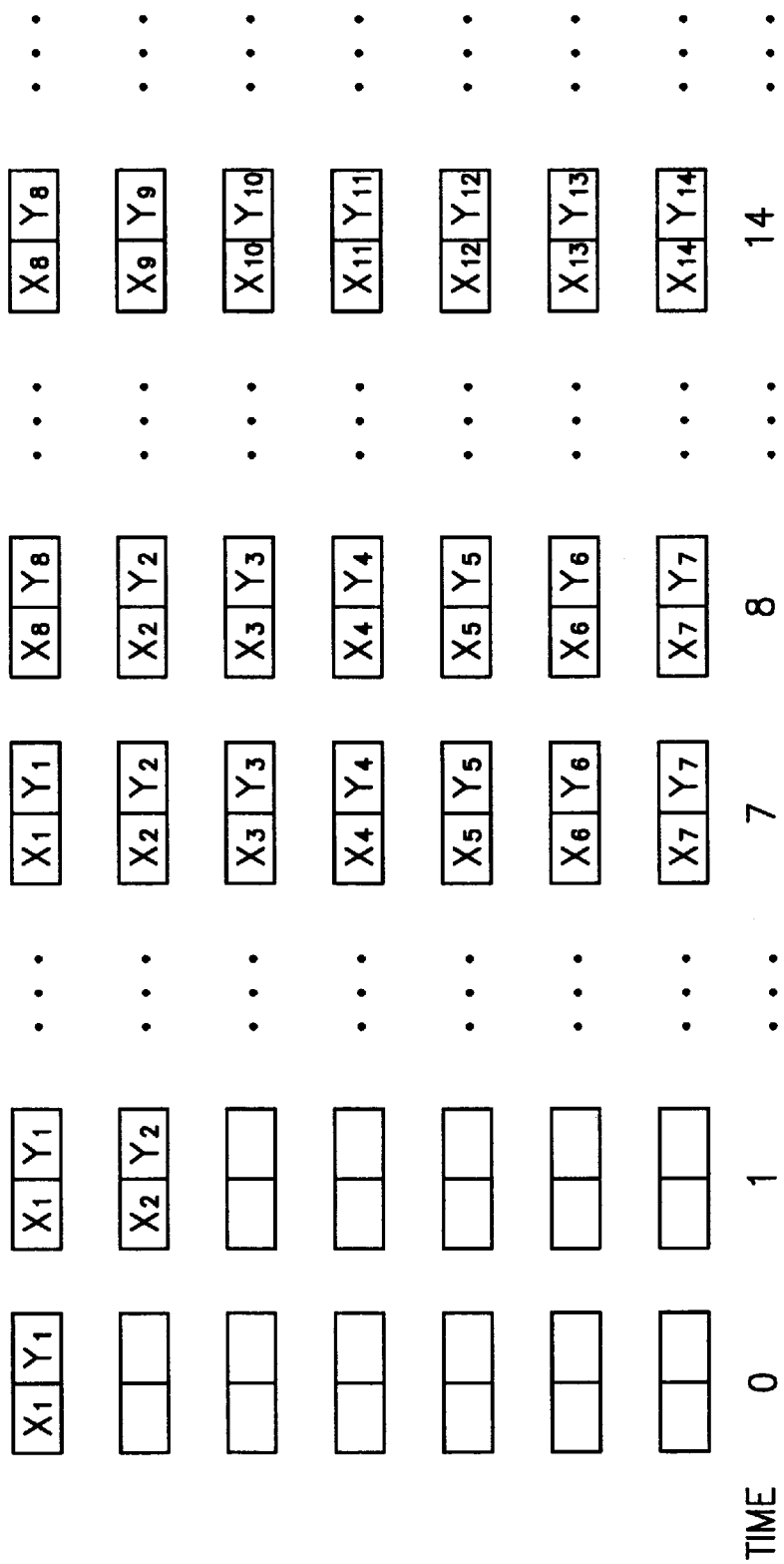
FIG. 2 is a block diagram illustrating the input buffer in FIG. 1 in response to input clock I-CLK.

At this time, referring to FIG. 2, there is shown a state in which the input buffer 2 of the encoding rate of 7/8 is varied according to input timing. Here, the input buffer 2 can be extended variably from 1 stage to n stages according to an encoding rate.

Data stored in the input buffer 2 is, in order, encoded according to an order of the compression matrix of the output data aligning control unit 3, and, the encoded data is transmitted to the output buffer 4. Now, a compression matrix is automatically selected according to an input encoding rate. Seven pairs of input data are compressed into four pairs of valid data to be transmitted and are outputted in a form of aligned data.

Referring to FIGS. 3A to 3C, there is illustrated input and output states of a puncturer having the encoding rate of ⅞.

Referring to FIG. 3A, there is illustrated a state of input data. Referring to FIG. 3B, there is illustrated a state of selected data according to a compression matrix. Referring to FIG. 3C, there is illustrated a state of output data.

Namely, referring again to FIG. 3A, the input data is inputted with seven pairs of data and are aligned by the input data aligning control unit 1 and are outputted to the output stage according to the input clock I-CLK inputted to the input buffer 2.

Seven pairs of data which are inputted, as shown in FIG. 3A, are selected and compressed according to the compression matrix in the output data aligning control unit 3, and are transmitted to the output stage in a form of data to be transmitted. Namely, seven pairs of input data are selected according to the compression matrix in the output data aligning control unit 3, and then four pairs of valid data are transmitted.

Thus, referring to FIG. 3C, the four pairs of compressed valid data according to the compression matrix are transmitted as data with a form to be transmitted after being aligned in the output buffer 4.

After the aligned and encoded data are stored in the output buffer 4, they are generated as final channel data, by synchronizing it with an output clock O-CLK. At this time, the relation between the input and output clocks I-CLK O-CLK is represented in the following expression:

a period of output clock O-CLK=a period of input clock I-CLK× (⅞)

Reexpressing the above relation according to a variable encoding rate:

a period of output clock O-CLK=a period of input clock I-CLK× (input rate/output rate)

Accordingly, a period of an output clock is in proportion to the input clock and a ratio of input data to output data.

On the other hand, a variable encoding rate puncturer according to the present invention aligns data using the input buffer 2 with a length which is varied in response to a variable encoding rate. Also, the output buffer 4 includes a data alignment structure for aligning the output data by the encoding compression matrix which is selected according to a variable encoding rate. Further, the output data aligning control unit 3 uses some PLA or memory structures for carrying out a compression matrix, and a register structure is replaced with the memory structures in expanding a variable encoding rate.

Accordingly, much more data can be transmitted by applying a puncturer with a variable encoding rate to an encoder for effectively transmitting data within the same conventional communication bandwidth.

As described above, a variable encoding rate puncturer is suitable for various variable encoding rates using very simple circuits and control units, and as to essential parts used in a data encoder of a digital broadcasting transmission system, it is possible to improve an encoding time and to be realized effectively within a small area.

Although the preferred embodiments of the present invention have been disclosed for illustrative purposes, those skilled in the art will appreciate that various modifications, additions and substitutions are possible, without departing from the scope and the spirit of the present invention as disclosed in the accompanying claims:

What is claimed is:

1. A variable encoding rate puncturer comprising:
   a control unit for controlling an alignment of input data, a selection of a compression matrix, and an alignment of output data according to a variable encoding rate inputted from an external circuit;
   an input data aligning control unit for outputting said aligned data in parallel in response to an input clock signal after aligning data with a variable encoding rate in response to a control of said control unit;
   an input buffer for storing, in order, said aligned data from said input data aligning control unit;
   an output data aligning control unit for selecting said aligned data from said input buffer according to said variable encoding rate under the control of said control unit and for outputting the selected data; and
   an output buffer outputting said selected data as encoded data from said output data aligning control unit in response to an output clock signal.

2. A variable encoding rate puncturer according to claim 1, wherein said input buffer expands variously according to said variable encoding rate.

3. A variable encoding rate puncturer according to claim 1, wherein said output buffer expands variously according to said variable encoding rate.

* * * * *